US010867873B2

(12) United States Patent
Specht et al.

(10) Patent No.: US 10,867,873 B2
(45) Date of Patent: Dec. 15, 2020

(54) METHOD AND DEVICE FOR MEASUREMENT OF A PLURALITY OF SEMICONDUCTOR CHIPS IN A WAFER ARRAY

(71) Applicant: OSRAM Opto Semiconductors GmbH, Regensburg (DE)

(72) Inventors: Holger Specht, Bad Abbach (DE); Roland Zeisel, Tegernheim (DE); Anton Vogl, Sinzing (DE); Jens Ebbecke, Rohr in Niederbayern (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/323,237

(22) PCT Filed: Jul. 25, 2017

(86) PCT No.: PCT/EP2017/068786
§ 371 (c)(1),
(2) Date: Feb. 4, 2019

(87) PCT Pub. No.: WO2018/024549
PCT Pub. Date: Feb. 8, 2018

(65) Prior Publication Data
US 2019/0189527 A1 Jun. 20, 2019

(30) Foreign Application Priority Data
Aug. 4, 2016 (DE) .......................... 10 2016 114 459

(51) Int. Cl.
*G01R 31/30* (2006.01)
*H01L 21/66* (2006.01)
(Continued)

(52) U.S. Cl.
CPC .......... *H01L 22/12* (2013.01); *G01R 31/2601* (2013.01); *G01R 31/2656* (2013.01); *G01R 31/311* (2013.01)

(58) Field of Classification Search
None
See application file for complete search history.

(56) References Cited

U.S. PATENT DOCUMENTS

| | | | |
|---|---|---|---|
| 6,184,046 B1 * | 2/2001 | Patterson | ................ H01L 22/12 257/E21.53 |
| 2004/0027149 A1 | 2/2004 | Aitren et al. | |

(Continued)

FOREIGN PATENT DOCUMENTS

| | | |
|---|---|---|
| DE | 4400949 C1 | 6/1995 |
| DE | 102013218062 A1 | 3/2015 |

OTHER PUBLICATIONS

"Electrically Conductive Rubber Sheets 5750-S," Company Holland Shielding System B.V., downloaded from https://hollandshielding.com/Electically-conductive-rubber-sheets-5750S, on Jan. 16, 2019, 4 pages.

*Primary Examiner* — Bradley Smith
(74) *Attorney, Agent, or Firm* — Slater Matsil, LLP (57) ABSTRACT

A method and a device for measuring a plurality of semiconductor chips in a wafer array are disclosed. In an embodiment a method for measuring the semiconductor chips in a wafer array, wherein the wafer array is arranged on an electrically conductive carrier so that in each case back contacts of the semiconductor chips are contacted by the carrier, wherein a contact structure is arranged on a side of the wafer array facing away from the carrier, and wherein the contact structure includes a contact element and/or a plurality of radiation-emitting measurement semiconductor chips, includes applying a voltage between the contact structure and the carrier and measuring the semiconductor (Continued)

chips depending on a luminous image which is generated by emitted radiation which is caused simultaneously by fluorescence when the semiconductor chips are illuminated or by a radiation-emitting operation of the measurement semiconductor chips when the voltage is applied.

13 Claims, 3 Drawing Sheets

(51) Int. Cl.
*G01R 31/311* (2006.01)
*G01R 31/26* (2020.01)
*G01R 31/265* (2006.01)

(56) References Cited

U.S. PATENT DOCUMENTS

| | | |
|---|---|---|
| 2004/0085083 A1 | 5/2004 | Tan et al. |
| 2009/0183363 A1 | 7/2009 | Yamada et al. |

\* cited by examiner

METHOD AND DEVICE FOR MEASUREMENT OF A PLURALITY OF SEMICONDUCTOR CHIPS IN A WAFER ARRAY

This patent application is a national phase filing under section 371 of PCT/EP2017/068786, filed Jul. 25, 2017, which claims the priority of German patent application 102016114459.2, filed Aug. 4, 2016, each of which is incorporated herein by reference in its entirety.

TECHNICAL FIELD

The invention is related to a method and a device for measuring a plurality of semiconductor chips in a wafer array.

BACKGROUND

In contrast to other characteristic values such as temperature, brightness or color distributions, inspection of semiconductor chips in a wafer array with regard to electrical characteristic values such as voltage and current density is conventionally carried out serially and is therefore associated with a high expenditure of time. In particular, electrical characteristic values cannot be measured over large areas in a single spatially resolved measurement using today's methods.

In order to obtain spatially resolved information about electrical characteristic values, rasterizing methods are particularly used, in which, for example, a measurement is made at each raster point on a so-called wafer prober. The raster points can correspond to individual semiconductor chips, whereby several such as six measuring points are usually contacted simultaneously by a needle spider. As a result of technological progress and the steady reduction of the area of semiconductor chips, an ever-increasing number of semiconductor chips can be produced in a wafer array. The measuring time with the use of the needle spider mentioned above thus continues to increase and thus contributes to an ever-increasing share of the manufacturing costs of the semiconductor chips.

SUMMARY OF THE INVENTION

Embodiment provide a method and a device for measurement a plurality of semiconductor chips in a wafer array, which enables a cost-effective, efficient measurement of the semiconductor chips.

According to a first aspect, the invention concerns a method for measurement of a plurality of semiconductor chips in a wafer array.

Semiconductor chips can, for example, be optoelectronic semiconductor chips such as light-emitting diodes. However, other electronic components manufactured in a wafer array, such as ESD protection diodes or ICs, are also conceivable. The semiconductor chips in the wafer array can be separated, for example, after the method for measurement has been carried out.

In at least one embodiment according to the first aspect, the wafer array is arranged on an electrically conductive carrier so that a back contact of the semiconductor chips is contacted by the carrier in each case. The carrier can, for example, be a so-called metal chuck. The carrier is especially designed to set the back contact of the semiconductor chips to a reference potential. The back contacts of the semiconductor chips are coupled in parallel with the reference potential, for example, with a ground potential, by the carrier.

In at least one of embodiment according to the first aspect, a contact structure is arranged on a side of the semiconductor chips facing away from the carrier. The contact structure comprises a contact element and/or a plurality of radiation-emitting measurement semiconductor chips. The contact structure is especially designed to set front contacts of the semiconductor chips to a further reference potential. The contact element, for example, can also be a metal chuck. As an example, the contact structure consists only of the contact element. Alternatively, the contact structure can, for example, also consist exclusively of the plurality of measurement semiconductor chips, which can be arranged in a wafer array as an example.

In at least one embodiment according to the first aspect, a voltage is applied between the contact structure and the carrier. Depending on an individual structure of the semiconductor chips and the resulting electrical characteristic values such as a conductivity of the semiconductor chips, a locally different current flow between the carrier and the contact structure occurs in each case. The locally different current flow, for example, leads to a targeted damage of individual semiconductor chips and/or enables a radiation-emitting operation of individual measurement semiconductor chips. The targeted damage of individual semiconductor chips can be used, for example, to identify semiconductor chips whose characteristic values lie outside a specified range.

In at least one embodiment according to the first aspect, a measurement of the semiconductor chips is carried out depending on a luminous image which is generated by emitted radiation which is caused simultaneously by fluorescence when the semiconductor chips are illuminated or by a radiation-emitting operation of the measurement semiconductor chips when the voltage is applied. The luminous image comprises a plurality of luminous points, wherein each luminous point is uniquely assigned to exactly one of the semiconductor chips.

A photoluminescent illuminator for irradiating the wafer array with short-wavelength light, such as green light, is particularly suitable for illumination. Defective semiconductor chips in the wafer array fluoresce comparatively little despite photoluminescence excitation, so that the radiation emitted by the semiconductor chips during illumination can be used as a luminous image for measuring the semiconductor chips. Alternatively, the radiation emitted by the radiation-emitting operation of the measurement semiconductor chips can be used as a luminous image for measuring the semiconductor chips.

For example, the luminous image can be captured by a camera system, evaluated and assigned to the semiconductor chips separately, i.e., with spatial resolution. The measurement of the semiconductor chips can include both a check of the individual semiconductor chips, i.e., a distinction between intact and defective semiconductor chips, and an assignment of characteristics of electrical characteristic values of the semiconductor chips, in particular voltage and current characteristics during operation of the semiconductor chips.

In at least one embodiment according to the first aspect, the wafer array is arranged on an electrically conductive carrier so that a back contact of the semiconductor chips is contacted by the carrier in each case. A contact structure, which comprises a contact element and/or a plurality of radiation-emitting measurement semiconductor chips, is then arranged on a side of the semiconductor chips facing away from the carrier. A voltage is then applied between the contact structure and the carrier and a measurement of the semiconductor chips is carried out depending on a luminous image which is generated by emitted radiation which is caused by fluorescence when the semiconductor chips are illuminated or by a radiation-emitting operation of the measurement semiconductor chips when the voltage is applied. The luminous image shows a plurality of luminous points, wherein each luminous point is uniquely assigned to exactly one of the semiconductor chips.

The parallel contacting of the semiconductor chips enables the measurement of the semiconductor chips to be carried out separately from each other, spatially resolved and simultaneously, in an advantageous manner. In particular, this contributes to an efficient and cost-effective measurement of semiconductor chips in the wafer array.

In at least one embodiment according to the first aspect, the wafer array is arranged on an electrically conductive carrier so that a back contact of the semiconductor chips is contacted by the carrier in each case. A contact structure consisting of a metal contact element is then arranged on a side of the semiconductor chips facing away from the carrier, and such a high voltage is applied in reverse direction of the semiconductor chips between the contact structure and the carrier that reversely weak semiconductor chips are damaged. Subsequently, a measurement of the semiconductor chips is performed depending on a luminous image which is generated by emitted radiation caused by fluorescence when the semiconductor chips are illuminated. The luminous image comprises a plurality of luminous points, wherein each luminous point is uniquely assigned to exactly one of the semiconductor chips. The radiation-emitting semiconductor chips are thereby classified as intact.

Reversely weak semiconductor chips are those semiconductor chips that have an actual breakdown voltage that deviates significantly from a specified target breakdown voltage. In other words, with reversely weak semiconductor chips, a current flow through the corresponding semiconductor chips in the breakthrough area of the semiconductor chip is already achieved when a voltage amount lower than the specified breakthrough voltage is applied.

Such damage to the semiconductor chips usually leads to arising a so-called shunt path in the semiconductor chip. Electrons and holes in the semiconductor material generated under photoluminescence illumination then recombine in an advantageous manner only non-radiatively via the shunt path, so that an emission of radiation by fluorescence is largely absent in defective semiconductor chips or only occurs in a strongly reduced form.

In at least one embodiment according to the first aspect, the wafer array is arranged on an electrically conductive carrier so that a back contact of the semiconductor chips is contacted by the carrier in each case. A contact structure consisting of an interconnection of a plurality of radiation-emitting measurement semiconductor chips is then arranged on a side of the semiconductor chips facing away from the carrier and a voltage is dimensioned and applied between the contact structure and the carrier such that measurement semiconductor chips, which are arranged in series with defective semiconductor chips, emit radiation. Subsequently, a measurement of the semiconductor chips is carried out depending on a luminous image which is generated by emitted radiation of the measurement semiconductor chips. The luminous image comprises a plurality of luminous points, wherein each luminous point is uniquely assigned to exactly one of the semiconductor chips. Semiconductor chips where the associated measurement semiconductor chip does not emit any radiation are classified as intact.

In at least one embodiment according to the first aspect, an electrically conductive layer for contacting front contacts of the semiconductor chips is arranged on a side of the wafer array facing away from the carrier between the semiconductor chips and the contact structure. The layer can be a polymer or elastomer such as a conductive rubber.

In particular, the layer is applied to the wafer array in such a way that height differences between the front contacts of laterally adjacent semiconductor chips are compensated. As an example, the layer is pressed onto the wafer array with a specified force in order to achieve a slight deformation of the layer. In an advantageous way, this enables reliable contacting of the semiconductor chips even with fault tolerances in the manufacture of the semiconductor chips and with contamination of the front contacts by dust particles or similar.

In an advantageous way, the electrically conductive layer enables simultaneous contacting of a multitude of contacts. The electrically conductive layer is preferentially formed over a large area.

In at least one embodiment according to the first aspect, the electrically conductive layer is designed such that the front contacts of the semiconductor chips are each contacted separately or substantially separately from front contacts of the laterally adjacent semiconductor chips.

In an advantageous way, thereby a radiation-emitting operation of the measurement semiconductor chips is made possible essentially independently of a radiation-emitting operation of laterally adjacent measurement semiconductor chips. This contributes to a reliable and unambiguous assignment of the luminous points in a luminous image generated by measurement semiconductor chips.

The contacting of the front contacts essentially separately from each other is made possible, for example, by a predetermined ratio of a layer thickness of the electrically conductive layer to a distance of the front contacts of laterally adjacent semiconductor chips. In the case that the layer is isotopically conductive, the layer thickness of the layer is exemplarily less than or equal to the lateral distance of the front contacts, so that a current flow through the layer is directed substantially transversely or perpendicularly to the lateral direction in a vertical direction. Alternatively or additionally, it is also conceivable to use a layer whose conductivity is increased in the vertical direction compared to its conductivity in the lateral direction. For example, the layer comprises vertical vias, vertically aligned metal filaments or the like for this purpose. This also allows a completely separate contacting of the front contacts.

In at least one embodiment according to the first aspect, the contact structure and the electrically conductive layer are jointly applied to the wafer array in one step. The contact structure and the layer preferably form one unit. A lateral extension of the contact structure and the layer does not necessarily have to coincide with a lateral extension of the wafer array, but rather only a part of the lateral extension of the wafer array and thus only a part of the semiconductor chips in the wafer array can be measured.

In at least one embodiment according to the first aspect, the electrically conductive layer is applied to the wafer array in a first step. In a separate subsequent step, the contact structure is arranged to the electrically conductive layer. The electrically conductive layer can in particular be a temporary layer. The electrically conductive layer is therefore preferred to be temporarily arranged to a plurality of semiconductor chips in the wafer array to be measured and is contacted by the contact structure.

In at least one of the embodiment according to the first aspect, the voltage between the contact structure and the carrier in reverse direction of the semiconductor chips is chosen so high that reversely weak semiconductor chips are damaged. The semiconductor chips in the wafer array that emit radiation during illumination are then classified as intact.

In at least one embodiment according to the first aspect, the voltage in reverse direction of the semiconductor chips is between 25 V and 150 V. In particular, the voltage in reverse direction of the semiconductor chips is between 50 V and 100 V.

In at least one embodiment according to the first aspect, in case that the contact structure comprises radiation-emitting measurement semiconductor chips, the voltage in flow direction of the semiconductor chips is larger than the sum of the threshold voltage of a measurement semiconductor chip and, if applicable, a voltage which drops at the electrically conductive layer. The contact structure is arranged to the wafer array in such a way that each semiconductor chip in the wafer array is assigned at least one measurement semiconductor chip, which is arranged in series in flow direction of the semiconductor chips in the wafer array. The semiconductor chips that emit radiation at the applied voltage are determined. The semiconductor chips in the wafer array that are not assigned to any of the radiation-emitting semiconductor chips are then classified as intact.

Defective semiconductor chips can thus be identified in an advantageous way where only a comparatively small voltage drop occurs (so-called micro current problem). In addition, a brightness of the emitted radiation can be measured, depending on which a corresponding defect can be further classified.

An embodiment of the at least one measurement semiconductor chip in series in flow direction of the semiconductor chip in the wafer array is understood here and in the following as an alignment of the contact structure and the wafer array with one another, in which both the at least one measurement semiconductor chip and the respective semiconductor chip in the wafer array are operated in the passband region when the voltage between the contact structure and the carrier is applied in flow direction of the semiconductor chips.

Here and in the following, the voltage drop at the electrically conductive layer is based on an estimated value which is determined by the current flow between the carrier and the contact structure as well as a specific electrical resistance of the layer.

In at least one embodiment in accordance with the first aspect, the voltage in flow direction of the semiconductor chips is smaller than the sum of the threshold voltage of a semiconductor chip in the wafer array, the threshold voltage of a measurement semiconductor chip of the contact structure and, if applicable, the voltage dropping at the electrically conductive layer.

In an advantageous way, this can contribute to keeping the current flow through intact semiconductor chips low. In particular, this can prevent radiation from being emitted by measurement semiconductor chips that are assigned to intact semiconductor chips.

In at least one embodiment according to the first aspect, in the case that the contact structure comprises radiation-emitting measurement semiconductor chips, the voltage in reverse direction of the semiconductor chips is larger than the sum of the threshold voltage of a measurement semiconductor chip and, if applicable, a voltage dropping at the electrically conductive layer. The contact structure is applied to the wafer array in such a way that each semiconductor chip in the wafer array is assigned at least one measurement semiconductor chip, which is arranged in series against the flow direction of the semiconductor chips in the wafer array. The semiconductor chips that emit radiation at the applied voltage are determined. The semiconductor chips in the wafer array that are not assigned to any of the radiation emitting semiconductor chips are then classified as intact.

Defective semiconductor chips can thus be identified in an advantageous way, where only a comparatively high reverse current flows. In addition, a brightness of the emitted radiation can be measured, depending on which a corresponding defect can be further classified.

An arrangement of the at least one measurement semiconductor chip in series against to the flow direction of the semiconductor chip in the wafer array is understood here and in the following to mean an orientation of the contact structure and of the wafer array with respect to one another, in which only the at least one measurement semiconductor chip in the passband region is operated, while the respective semiconductor chip in the wafer array is operated in the reverse region when the voltage between the contact structure and the carrier is applied against the reverse direction of the semiconductor chips.

In at least one embodiment according to the first aspect, the applied voltage is set to at least one predetermined characteristic value during the measurement of the semiconductor chips depending on the luminous image. A brightness characteristic value of the measurement semiconductor chips is then determined in each case. The brightness characteristic value is thereby representative of the brightness of the emitted radiation in each case. Depending on the brightness characteristic value determined, a current density is inferred in each case which flows through the respective semiconductor chip.

In an advantageous way, a current distribution can thus be determined in parallel for the plurality of semiconductor chips in the wafer array one after the other for different voltages applied in each case.

According to a second aspect, the invention concerns a device for measuring a plurality of semiconductor chips in a wafer array. The device comprises an electrically conductive layer for direct contacting of one contact each of the semiconductor chips. The electrically conductive layer is designed in particular to contact a multitude of the contacts of the semiconductor chips simultaneously.

In addition, the device comprises a contact structure arranged on the electrically conductive layer, the contact structure being electrically coupled to the electrically conductive layer. The contact structure is designed to contact the plurality of semiconductor chips in parallel via the electrically conductive layer. In particular, the contact structure and the layer form a construction unit.

The device can be used in particular for the measurement of a plurality of semiconductor chips in a wafer array using a method according to the first aspect. The features disclosed in connection with the method according to the first aspect therefore also apply to the device according to the second aspect and vice versa.

By directly contacting the contacts of the semiconductor chips, a structuring of the conductive layer or an additional contact layer between the conductive layer and the wafer array can be avoided. With benefit, a precise alignment of the individual contacts of the semiconductor chips is only optional, thus facilitating the positioning of the device on the wafer array.

In at least one embodiment according to the first or second aspect, the electrically conductive layer comprises or consists of a polymer. In particular, this can be an elastomer such as a conductive rubber.

The conductive layer not only compensates for unevenness during the contacting of the semiconductor chips, but also allows a cross line between the contacts of the semiconductor chips, i.e., in the lateral direction, to be kept highly resistive, so that mutual interference in the measurement of the semiconductor chips is reduced or prevented. In addition, the conductive layer can serve as a high-impedance series resistor that limits current flow between the contact structure and the contacts of the semiconductor chips.

The electrical properties of the conductive layer can at least partially be integrated into the contact structure. For example, it is conceivable to reproduce the low conductivity in the lateral direction by a suitable layer structure of epitaxial layers of the contact structure.

The contact structure is embodied in a flexible manner in at least one embodiment according to the first or second aspect. In particular, the contact structure is designed in such a way that it adapts to the plurality of semiconductor chips to be measured in the wafer array. In other words, the contact structure can already compensate for unevenness in the contacting of the semiconductor chips.

In at least one embodiment according to the first or second aspect, the electrically conductive layer has a thickness between 100 nm and 1 mm. This enables the compensation of unevenness as well as a low transverse conductivity.

In at least one design form according to the first or second aspect, the electrically conductive layer is anisotropically conductive. This allows the mutual influence during the measurement of the semiconductor chips to be kept particularly low.

In at least one embodiment of a first and a second aspect, the electrically conductive layer comprises a plurality of vertical vias for contacting the semiconductor chips. One via can be assigned to one contact of the semiconductor chips in each case.

In at least one embodiment according to the first or second aspect, the electrically conductive layer is isotropically conductive.

In at least one embodiment according to the first or second aspect, the electrically conductive layer is flat or substantially flat. A flat or essentially flat layer is understood in particular as a layer which has not undergone any structuring process steps, i.e., is unstructured. A surface of the conductive layer therefore prefers not to comprise any depressions, elevations or curvatures which are not unavoidable due to the manufacturing process.

In at least one embodiment according to the first or second aspect, the electrically conductive layer is arranged to selectively limit a current flow between the contact structure and the contacts of the semiconductor chips. In this context, the conductive layer is an example of a high-impedance series resistor. In particular, the targeted limitation of the current flow between the contact structure and the contacts of the semiconductor chips can be achieved by means of the electrically conductive layer through its specific electrical resistance and/or its thickness, in particular through a suitable combination of the specific electrical resistance of the conductive layer and its thickness. A range of specific electrical resistance*the thickness of the conductive layer of 0.1 $\Omega*mm^2 < x < 100$ k $\Omega*mm^2$, in particular 1 $\Omega*mm^2 < x < 1$ k $\Omega*mm^2$ would be conceivable, for example. The specific electrical resistance, for example, can be selected from one of the following ranges.

In at least one embodiment according to the first or second aspect, the electrically conductive layer comprises a resistivity between $0.01 \times 10^{-3}$ $\Omega$m and $0.01 \times 10^{-2}$ $\Omega$m.

In at least one embodiment according to the first or second aspect, the contact structure consists of a metal contact element. The measurement can thus be carried out particularly easily and cost-effectively.

In at least one embodiment according to the first or second aspect, the contact structure consists of interconnection of a plurality of radiation-emitting measurement semiconductor chips. This allows an accurate measurement of the electrical characteristics of the semiconductor chips.

An electrical connection of the device can, for example, be made over a large area via an optically transparent contact layer such as a transparent conductive oxide (TCO), for example, indium tin oxide (ITO). Alternatively, the electrical connection can also be made via side contacts, wherein in this case the device advantageously comprises a flat current<reference potential over the plurality of radiation-emitting measurement semiconductor chips.

In particular, the interconnection of the plurality of measurement semiconductor chips comprises a substrate that is transparent to emitted radiation of the measurement semiconductor chips. In this context, the measurement semiconductor chips are designed, for example, as infrared emitting LEDs which are arranged on a GaAs substrate. The GaAs substrate can be used for current expansion in an advantageous way by selecting the appropriate doping. In the case of an electrical connection via side contacts, a sapphire substrate would also be conceivable, for example, in which the measurement semiconductor chips are contacted via an additional current expansion layer on the substrate.

According to a third aspect, the invention concerns a method for manufacturing a plurality of semiconductor chips in a wafer array. In particular, the method can be used for loading and subsequent characterization of semiconductor chips.

In the method, the wafer array is arranged on an electrically conductive carrier, analogous to the method according to the first aspect, so that a back contact of the semiconductor chips is contacted by the carrier in each case.

Furthermore, analogous to the method according to the first aspect, a contact structure is arranged on a side of the semiconductor chips facing away from the carrier, which comprises or consists of a contact element.

In addition, a voltage is applied between the contact structure and the carrier, analogous to the method according to the first aspect. The voltage between the contact structure and the carrier in reverse direction of the semiconductor chips is so high that reversely weak semiconductor chips are damaged. In particular, the thereby resulting locally different current flow can cause targeted damage to individual semiconductor chips.

The targeted damage of reversely weak semiconductor chips ensures that only fully functional and defective semiconductor chips emerge from manufacturing, but not partially functional semiconductor chips whose actual electrical characteristic values deviate greatly from their nominal electrical characteristic values.

The targeted damaged semiconductor chips may appear darker or black compared to the partially or fully functional semiconductor chips, for example, due to heat development as a result of the current flow. Following the manufacturing process, the damaged semiconductor chips can be sorted out manually or mechanically in a simplified manner.

In at least one embodiment according to the third aspect, a measurement of the semiconductor chips is carried out depending on the appearance of the semiconductor chips. In a first embodiment version analogous to the method according to the first aspect, the appearance is generated by emitted radiation, which is simultaneously caused by fluorescence when the semiconductor chips are illuminated.

Alternatively, the appearance in a second embodiment version is generated by reflected radiation, which is simultaneously reflected when the semiconductor chip is illuminated. In both embodiment versions, the appearance comprises a plurality of luminous point, wherein each luminous point is uniquely assigned to exactly one of the semiconductor chips.

The appearance in the first embodiment version can be in particular the luminous image according to the first aspect.

In the second embodiment version, other optical distinctive features of the semiconductor chips can also be used for the measurement. As mentioned above, the defective semiconductor chips can be detected as dark or black image point, which serves as an indicator to distinguish between intact and defective semiconductor chips.

BRIEF DESCRIPTION OF THE DRAWINGS

Further advantages, advantageous embodiments and developments result from the following in connection with the figures of described embodiments.

Identical or equivalent elements are provided with the same reference signs in the figures. The components shown in the figures as well as the proportions of the components among each other are not to be regarded as true to scale.

DETAILED DESCRIPTION OF ILLUSTRATIVE EMBODIMENTS

Figure 1:
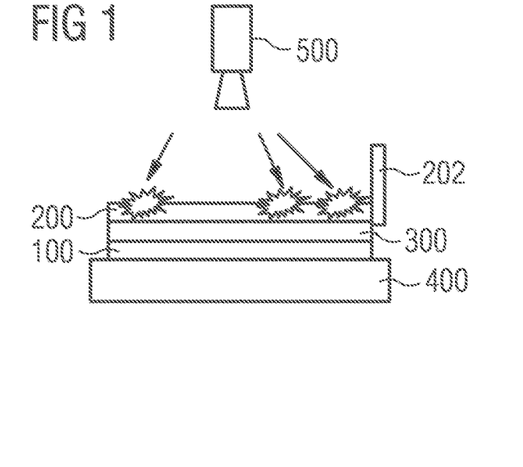
FIG. 1 shows an embodiment for the measurement of a plurality of semiconductor chips in a wafer array.

FIG. 1 shows a first embodiment for the measurement of a plurality of semiconductor chips in the wafer array. A wafer array 100 to be measured with a plurality of semiconductor chips 10 (see FIGS. 5-7b) is arranged on a carrier 400, for example, a metal chuck. The wafer array 100 is then brought into contact with a conductive layer 300 of polymer and a contact structure 200 across the entire surface. The contact structure 200 can also be described as a so-called "probe wafer". A voltage is then applied between the carrier 400 and the contact structure 200, for example, via a side contact 202. The contact structure 200 comprises a plurality of measurement semiconductor chips 20 (see FIGS. 2-6) which then emit radiation which is detected in spatial resolution by a camera system 500.

Figure 2:
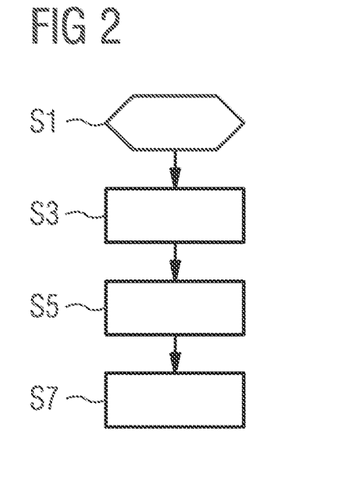
FIG. 2 shows an embodiment of a flowchart for measurement of the semiconductor chips according to FIG. 1.

Using the exemplary flow chart in FIG. 2, the method steps for measurement of the semiconductor chips 10 according to FIG. 1 are explained in more detail below.

In a step S1, the wafer composite 100 is arranged on a carrier 400 and the contact structure 200 with the conductive layer 300 is applied to the wafer array 100.

In a subsequent step S3, a voltage between the carrier 400 and the contact structure 200 is set to a predetermined voltage characteristic value and the radiation then emitted by individual measurement semiconductor chips 20 is recorded. The detected radiation is then assigned to the emitting measurement semiconductor chips with spatial resolution by means of image processing and a respective brightness characteristic value is determined which represents a brightness of the respective radiation.

In a subsequent step S5, the respective brightness characteristic value of the measurement semiconductor chips 20 is compared with the calibration data of the respective measurement semiconductor chips 20, and a current density flowing through the respective measurement semiconductor chip 20 is determined depending on the calibration data and the respective brightness characteristic value.

For example, the calibration data is generated in advance by injecting a constant current one after another into each measurement semiconductor chip 20 individually or averaged over several measurement semiconductor chips 20 and measuring the brightness of the radiation produced.

In a further step S7, the measurement semiconductor chips 20 are assigned to the semiconductor chips 10 of the wafer array 100 to be measured. Depending on the respective current density flowing through the respective measurement semiconductor chips 20 assigned to a semiconductor chip 10, a current characteristic value corresponding to the voltage characteristic value is determined and assigned to the semiconductor chip 10.

The method is subsequently continued, for example, with a further voltage characteristic value analogous to step S3, in order to create a voltage and current characteristic for each semiconductor chip 10 in parallel from the voltage characteristic values and the determined current characteristic values. The measurement is thereby made in flow direction (see FIG. 5).

Alternatively, the method is subsequently terminated. As an example, the current flow can be made visible in a single measurement via the light distribution in the contact structure with spatial resolution for the entire wafer array 100. In an advantageous way, the measurement duration is therefore independent of the lateral extension of the wafer array 100, so that a reduction in the manufacturing costs of the semiconductor chips 10 can be achieved.

Figure 3:
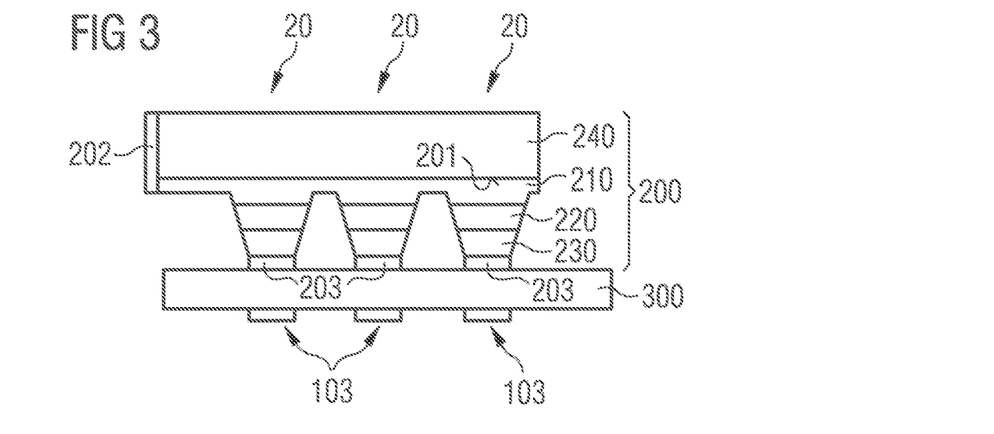
FIG. 3 shows an embodiment of a device for measurement of semiconductor chips according to FIG. 1.
Figure 4:
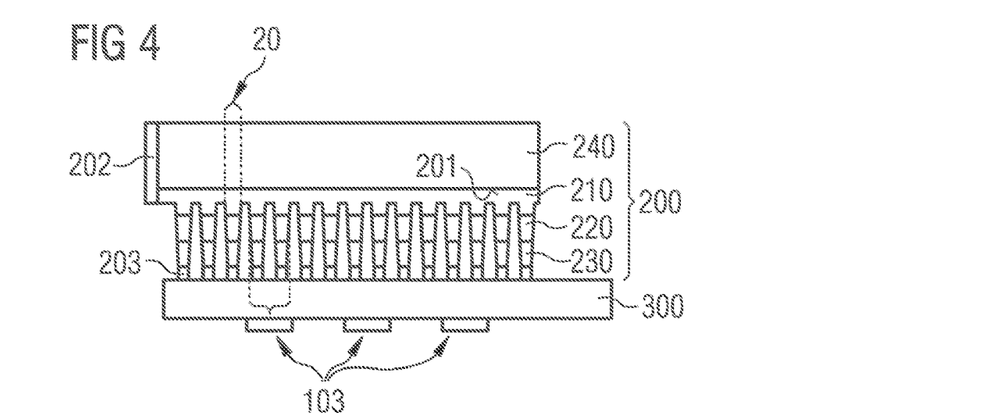
FIG. 4 shows a further embodiment of a device for measurement of semiconductor chips according to FIG. 1.

FIG. 3 shows an exemplary first embodiment version of a device for measurement of the semiconductor chips 10 according to FIG. 1. The device comprises the contact structure 200 and a contact foil of elastic polymer as conductive layer 300. The contact structure 200 comprises a typical LED structure which is arranged on an optically transparent substrate 240, such as glass or polished sapphire. The LED structure comprises a first semiconductor layer 210, an active layer 220 for generating or detecting electromagnetic radiation, and a second semiconductor layer 230. The first and second semiconductor layers 210, 230 each denote semiconductor layers of different types and may each comprise one or more n-doped or p-doped semiconductor layers. The active layer can, for example, be a double heterostructure, a single quantum well structure or a multiple quantum well structure. The LED structure is divided into several laterally adjacent measurement semiconductor chips 20, each of which can be coupled to a reference potential via a side contact 202 with its rear side 201. The measurement semiconductor chips 20 are arranged on the layer 300 via a metallization 203 made of, e.g., gold. The device can be coupled to the semiconductor chips 10 via the layer 300, as shown here by front contacts 103 of the semiconductor chips 10. A number, structure and/or dimensioning of the measurement semiconductor chips 20 is adapted here with advantage to the structure to be measured. In the first embodiment version, for example, as shown in FIG. 3, each front contact 103 is assigned a measurement semiconductor chip 20. Alternatively, the number of measurement semiconductor chips 20 may exceed the number of front contacts 103. As shown in a second embodiment version using FIG. 4, several measurement semiconductor chips 20 can each be assigned to one contact. In an advantageous way, the device can be used universally for any type of semiconductor chip.

Figure 5:
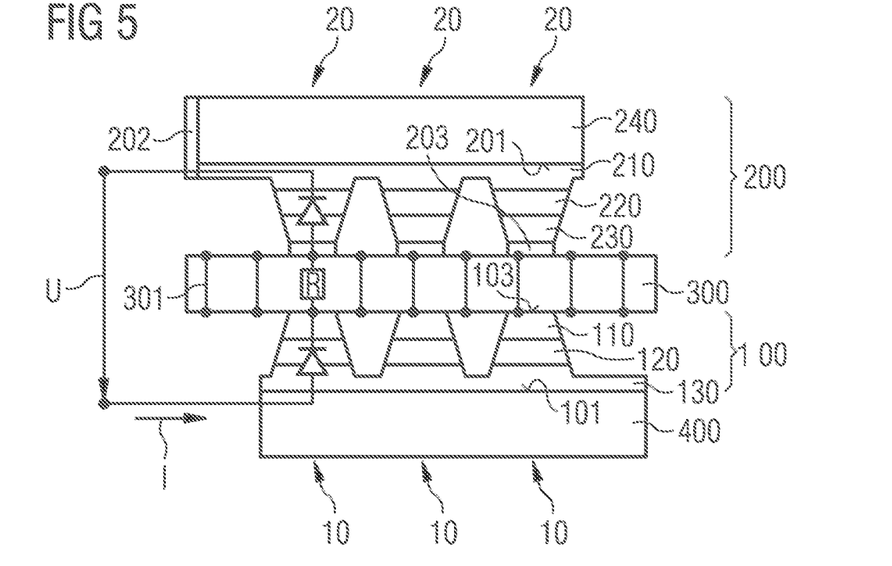
FIG. 5 shows an embodiment of the measurement of the semiconductor chips according to FIG. 1.

FIG. 5 shows an exemplary first embodiment version of the measurement of the semiconductor chips 10 according to FIG. 1. This is, for example, a micro current measurement of the semiconductor chips 10. The contact structure 200 corresponds to the contact structure shown in FIG. 3, which is applied to the wafer array 100 in such a way that the diodes formed by the semiconductor chips 10 and measurement semiconductor chips 20 are connected in series in flow direction as schematically shown. The layer 300 serves again as a contact layer with height compensation to contact all semiconductor chips in the wafer array. In this embodiment version, the layer 300 is anisotropically conductive as an example. In this context, the layer comprises 300 low-resistance vias 301. Alternatively, the layer 300 can also be thin and isotropic with a high resistance to ensure a low transverse conduction. For example, a layer thickness of the layer 300 is less than or equal to the lateral distance of adjacent front contacts 103 of semiconductor chips 10. The semiconductor chips 10 comprise a first semiconductor layer 110, an active layer 120, and a second semiconductor layer 130, analogous to the measurement semiconductor chips 20. In this example, the first semiconductor layer 110, 210 is n-doped, the second semiconductor layer 130, 230 p-doped. The front contacts 103 of the semiconductor chips 10 are coupled with the layer 300. Via back contacts 101, the semiconductor chips 10 are coupled to a ground potential by means of the carrier 400.

A voltage U, which is smaller than the sum of the two threshold voltages of the diodes plus an occurring voltage difference across the layer 300, is applied between the contact structure 200 and the carrier 400. Where intact semiconductor chips 10, a sufficiently high voltage drops so that the assigned measurement semiconductor chips 20 do not light up. In the case of a micro current problem, however, the voltage drop at the semiconductor chip 10 is lower, so that the assigned measurement semiconductor chips 20 light up. The brightness of the measurement semiconductor chips 20 also provides information about the current I flowing through, i.e., the strength of the micro current problem.

Figure 6:
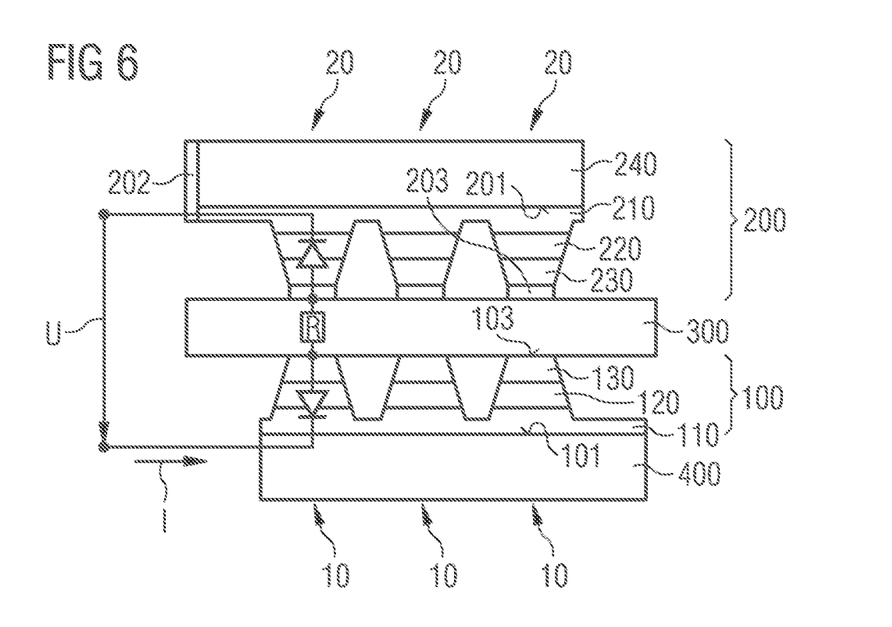
FIG. 6 shows a further embodiment of the measurement of the semiconductor chips according to FIG. 1.

FIG. 6 shows an exemplary second embodiment version of the measurement of the semiconductor chips 10 according to FIG. 1. This is, for example, a detection of increased reverse currents in the semiconductor chips 10. In contrast to the previous embodiment version, the contact structure 300 is applied to the wafer array 100 in such a way that, as schematically shown, the diodes formed by the semiconductor chips 10 and the measurement semiconductor chips 20 are connected in series in the opposite direction. In this embodiment, the first semiconductor layer 110 is p-doped, the second semiconductor layer 130 n-doped. The layer 300 serves on the one hand as a contact layer with height compensation and on the other hand as a high-impedance series resistor for current limitation and lateral decoupling of adjacent semiconductor chips 10. If the reverse current I through the semiconductor chip 10 is low, only a low voltage drops at the measurement semiconductor chip 20 and this does not light. If the reverse current I is increased, e.g., if the semiconductor chip 10 is defective, the measurement semiconductor chip 20 lights up; the level of the reverse current I can also be inferred from the brightness.

Figure 7A:
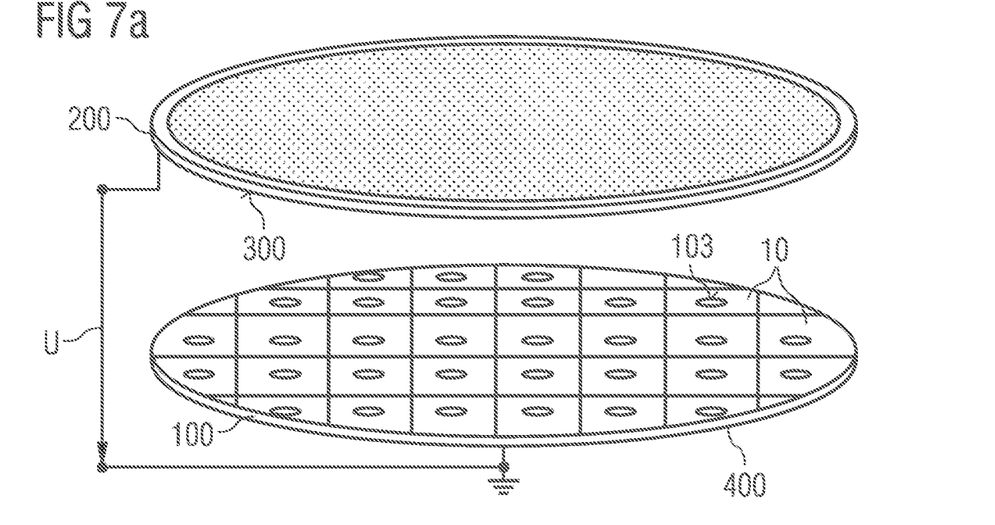
FIGS. 7a and 7b show a further embodiment for the measurement of a plurality of semiconductor chips in the wafer array.
Figure 7B:
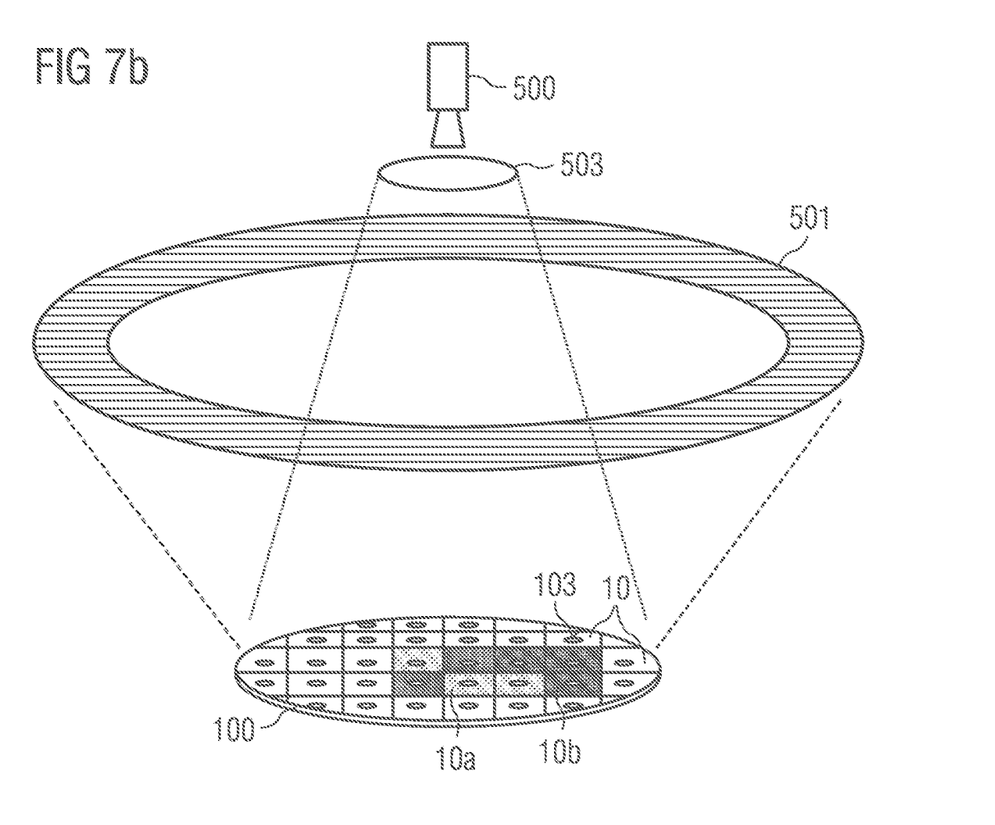

FIGS. 7a and 7b show a second embodiment for the measurement of a plurality of semiconductor chips 10 in the wafer array 100. The wafer array 100 is arranged on a carrier 400 and the semiconductor chips 10 are contacted over their entire surface by means of a conductive layer 300 of rubber, which is applied to a contact structure 200 designed as a metal chuck (FIG. 7a). Then a counter voltage pulse of, e.g., −100 V is applied for 10 s between the contact structure 200 and the carrier 400. Due to the parallel connection, all semiconductor chips 10 are subjected to the same load. In semiconductor chips 10 with reverse weakness, a current of about 4 mA flows, which generates a shunt and thereby damages the semiconductor chips. The current flowing locally can be adjusted by the conductivity of the rubber, which is a series resistance. In this context, such an energy input into the semiconductor chip 10 can be set that the shunt generated is large enough to be detected in a subsequent method step (FIG. 7b).

In the following method step, the semiconductor chips 10 are irradiated by means of a photoluminescent illuminator 501. In case of intact semiconductor chips 10a, electrons and holes generated by radiation optically recombine. The resulting fluorescence can be captured by the camera system 500. In case of defective semiconductor chips 10b, on the other hand, the electrons and holes recombine non-radiatively via the shunt path; these semiconductor chips 10 remain comparatively dark.

The photoluminescent illuminator 501, for example, can be a ring of LEDs with an optical short-pass filter, e.g., green LEDs. In an advantageous way, the ring is arranged in such a way that a homogeneous, short-wave irradiation of the semiconductor chips 10 occurs. Fluorescence, for example, is detected by an optical long-pass filter 503 of the camera system 500. The method step 7b can also be performed on already isolated semiconductor chips.

The invention is not limited by the description using the embodiments to these. Rather, the invention includes any new feature and any combination of features, which in particular includes any combination of features in the patent claims and subsequent concepts, even if that feature or combination itself is not explicitly provided in the patent claims, subsequent concepts or embodiments.

The invention claimed is:

1. A method for measuring a plurality of semiconductor chips in a wafer array, wherein the wafer array is arranged on an electrically conductive carrier so that in each case back contacts of the semiconductor chips are contacted by the carrier, wherein a contact structure is arranged on a side of the semiconductor chips facing away from the carrier, and wherein the contact structure comprises a contact element and/or a plurality of radiation-emitting measurement semiconductor chips, the method comprising:

applying a voltage between the contact structure and the carrier; and measuring the semiconductor chips depending on a luminous image which is generated by emitted radiation which is caused simultaneously by fluorescence when the semiconductor chips are illuminated or by a radiation-emitting operation of the measurement semiconductor chips when the voltage is applied, wherein the luminous image comprises a plurality of luminous points, and wherein each luminous point is uniquely assigned to exactly one of the semiconductor chips.

2. The method according to claim 1, further comprising an electrically conductive layer arranged between the semiconductor chips and the contact structure, wherein the electrically conductive layer contacts front contacts of the semiconductor chips.

3. The method according to claim 2, wherein the electrically conductive layer is designed such that the front contacts of the semiconductor chips are contacted separately from the front contacts of laterally adjacent semiconductor chips.

4. The method according to claim 2, wherein the contact structure and the electrically conductive layer are jointly applied to the wafer array in one step.

5. The method according to claim 2,
wherein the electrically conductive layer comprises a polymer, or
wherein the electrically conductive layer has a layer thickness between 100 nm and 1 mm, or
wherein the electrically conductive layer is isotropically conductive, or
wherein the electrically conductive layer has a specific electrical resistance between $0.001 \times 10^{-2}$ $\Omega$m and $0.01 \times 10^{-2}$ $\Omega$m.

6. The method according to claim 2, wherein the electrically conductive layer is substantially flat.

7. The method according to claim 2, wherein the electrically conductive layer is designed to selectively limit a current flow between the contact structure and the front contacts of the semiconductor chips.

8. The method according to claim 1,
wherein the contact structure consists essentially of a metal contact element, or
wherein the contact structure consists of an interconnection of a plurality of radiation-emitting measurement semiconductor chips.

9. The method according to claim 1,
wherein the voltage between the contact structure and the carrier in a reverse direction of the semiconductor chips is selected to be high such that reversely weak semiconductor chips are damaged, and
wherein those semiconductor chips in the wafer array that emit radiation during illumination are classified as intact.

10. The method according to claim 1,
wherein, when the contact structure comprises radiation-emitting measurement semiconductor chips, a voltage in a flow direction of the semiconductor chips is larger than a sum of a threshold voltage of a measurement semiconductor chip when the voltage drops at the electrically conductive layer,
wherein the contact structure is applied to the wafer array such that each semiconductor chip in the wafer array is assigned in each case to at least one measurement semiconductor chip which is arranged in series in the flow direction of a semiconductor chip in the wafer array,
wherein those measurement semiconductor chips are determined which emit radiation at the applied voltage, and
wherein those semiconductor chips in the wafer array to which none of the radiation-emitting measurement semiconductor chips is assigned are classified as intact.

11. The method according to claim 10, wherein the voltage in the flow direction of the semiconductor chips is smaller than a sum of the threshold voltage of a semiconductor chip in the wafer array when the voltage drops at the electrically conductive layer.

12. The method according to claim 10, wherein measuring the semiconductor chips depending on the luminous image comprises:
setting the applied voltage to at least one predetermined characteristic value;
determining in each case a brightness characteristic value of the measurement semiconductor chips, the brightness characteristic value being representative for a brightness of the emitted radiation; and
inferring a current density which flows through the respective semiconductor chip depending on the determined brightness characteristic value.

13. The method according to claim 2,
wherein, when the contact structure comprises the radiation-emitting measurement semiconductor chips, the voltage in a reverse direction of the semiconductor chips is larger than a sum of a threshold voltage of a measurement semiconductor chip when the voltage drops at the electrically conductive layer,
wherein the contact structure is applied to the wafer array such that each semiconductor chip in the wafer array is assigned in each case to at least one measurement semiconductor chip which is arranged in series against a flow direction of a semiconductor chip in the wafer array,
wherein those measurement semiconductor chips are determined which emit radiation at the applied voltage, and
wherein those semiconductor chips in the wafer array to which none of the radiation-emitting measurement semiconductor chips is assigned are classified as intact.

\* \* \* \* \*

UNITED STATES PATENT AND TRADEMARK OFFICE
CERTIFICATE OF CORRECTION

PATENT NO. : 10,867,873 B2
APPLICATION NO. : 16/323237
DATED : December 15, 2020
INVENTOR(S) : Holger Specht et al.

Page 1 of 1

It is certified that error appears in the above-identified patent and that said Letters Patent is hereby corrected as shown below:

In the Claims

In Column 13, Line 53, Claim 10, delete "claim 1" and insert --claim 2--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*